United States Patent [19]

Eckels et al.

[11] Patent Number: 5,571,602

[45] Date of Patent: Nov. 5, 1996

[54] SUPERCONDUCTING JOINTS FOR SUPERCONDUCTING SHEETS

[75] Inventors: Phillip W. Eckels; Delton A. Grey, Jr.; Christopher G. King, all of Florence; Anthony Mantone, Effingham; O'Neil T. McClam; Granville G. Ward, Jr., both of Florence, all of S.C.

[73] Assignee: General Electric Company, Milwaukee, Wis.

[21] Appl. No.: 366,188

[22] Filed: Dec. 29, 1994

[51] Int. Cl.⁶ ........................................ B32B 9/00
[52] U.S. Cl. .................. 428/195; 428/930; 428/662; 29/599; 505/925; 505/927
[58] Field of Search .................................. 428/662, 930, 428/195, 209; 505/925, 927, 887, 926; 174/125.1; 29/599; 427/62

[56] References Cited

U.S. PATENT DOCUMENTS

| | | | |
|---|---|---|---|
| 3,895,432 | 7/1975 | Diepers | 29/599 |
| 3,913,044 | 10/1975 | Albrecht | 505/887 |
| 4,528,740 | 8/1981 | Young | 427/62 |
| 5,290,638 | 3/1994 | Williams | 428/662 |

*Primary Examiner*—Patrick J. Ryan
*Assistant Examiner*—Patrick R. Jewik
*Attorney, Agent, or Firm*—Irving M. Freedman; John H. Pilarski

[57] ABSTRACT

A superconducting magnet shield includes a plurality of overlapping NbTi sheets welded together with a plurality of welds extending along elongated parallel slots in the overlap region with the slots extending in the direction of superconducting current flow.

12 Claims, 1 Drawing Sheet

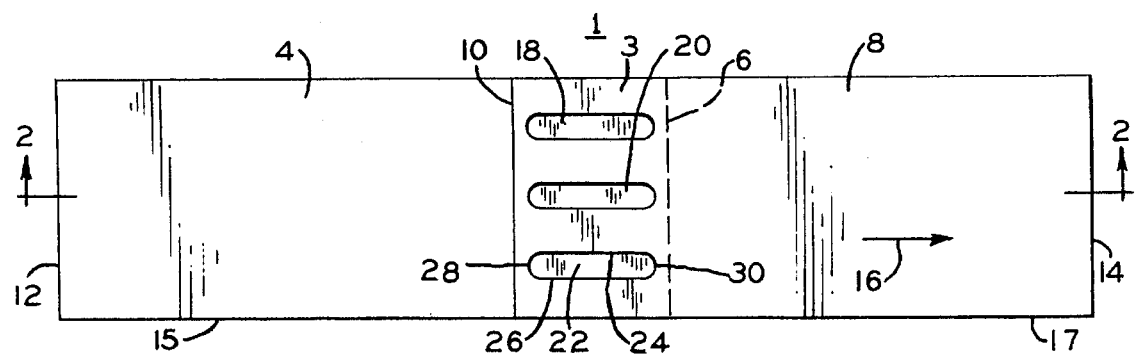
FIG_1
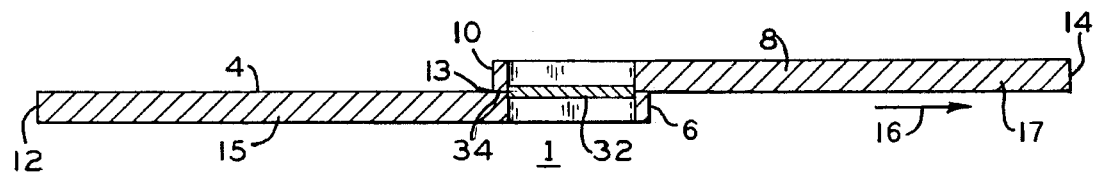
FIG_2
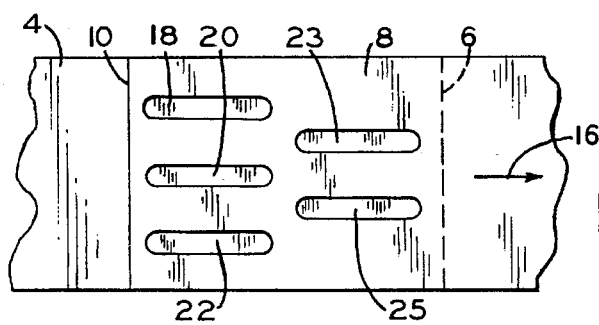
FIG_4
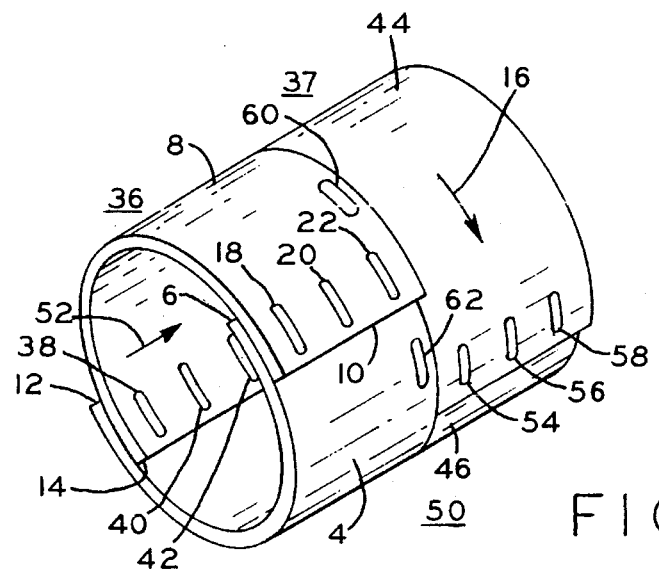
FIG_3

SUPERCONDUCTING JOINTS FOR SUPERCONDUCTING SHEETS

This invention relates to superconducting magnets suitable for magnetic resonance imaging (hereinafter called "MRI"), and more particularly to an improved means for providing large sheets of superconducting material suitable for use in shielding superconducting magnets.

BACKGROUND OF INVENTION

It has been found desirable in superconducting magnets used, for example, in magnetic resonance imaging (MRI) to include superconducting shields surrounding the bore of the superconducting magnet. Such shields are used to confine and separate the strong magnetic fields generated within the bore of the superconducting magnet from the surrounding environment, which may be a hospital utilizing a plurality of surrounding electronic equipment which could be adversely affected by the MRI magnetic fields, and from RF pulses used in the MRI Imaging.

However, superconducting sheet material tends to be hard and/or brittle and is extremely difficult to manufacture in large sheets. Superconducting sheets such as niobium-tin ($Nb_3Sn$) as well as niobium-titanium (NbTi) are materials suitable for superconducting operation. However, because of manufacturing difficulties, such materials are not available in sheets having sufficiently large areas of continuous, high quality superconducting sheet adequate to surround the bore of a typical MRI superconducting magnet which commonly has circumferences in the range of 0.8–1.0 meters. Sheets of NbTi, for example, must as a result be joined together to fabricate a tubular shield large enough to surround such a magnet bore, which frequently has an axial length in the order of 2.0 meters. As a result, it becomes necessary to be able to fabricate shields which are in the order of 1 meter in diameter and 2 meters long, and which require the joining of two or more separate sheets of superconducting material to fabricate the shield. However, the joining method must maintain superconducting operation across the joint, that is maintain a current density (Jc) in the order of $3.85 \times 10^8$ $A/M^2$ (amps per square meter) at 2 Tesla, which is at least 22% of the starting material.

Equally important, the completed shield must be capable of superconducting operation with joints which do not interfere with, or preclude, superconducting operation and must not provide excessive heating which would require excessive cryogen to cool the shield to superconducting temperatures. Moreover, the integrated sheets notwithstanding the relatively brittle material must be able to be formed into continuous cylinders, and the resultant superconducting operation should be stable.

OBJECTS AND SUMMARY OF INVENTION

It is an object of the present invention to provide large sheets of superconducting material suitable for use in shielding superconducting magnets which are stable in operation.

It is another object of the present invention to provide large sheets of superconducting material formed from a plurality of smaller sheets and including welds which provide superconducting joints with a minimum of heating during operation.

It is yet another object of the present invention to join sheets of NbTi superconducting material for use as shields in superconducting magnets, with sheets being sufficiently flexible notwithstanding the joints for use as shields surrounding the bore and also the superconducting magnet.

In accordance with one form of the invention, a superconducting sheet for an MRI shield is formed into a cylindrical shield and includes a plurality of smaller sheets of NbTi which are overlapped and joined together by welds which include elongated apertures in the overlapped regions with the welds extending along the long sides of the elongated aperture in the direction of current flow during operation. The welds are NbTi extending a distance of 2 to 3 centimeters. The aperture, or slots, form buttonhole-like joints which are superconducting in operation.

BRIEF DESCRIPTION OF INVENTION

FIGS. 1 and 4 are a top view of the joints in sheets of superconducting material which are joined to form the superconducting shield of FIG. 3 in accordance with the present invention.

FIG. 2 is a cross-sectional side view of FIG. 1, taken along lines 2—2 of FIG. 1.

FIG. 3 shows a superconducting shield in accordance with the present invention.

Referring to FIGS. 1 and 2 first sheet 8 of NbTi is positioned overlapping with second sheet 4 of NbTi forming overlap region 3 in the order of up to 3 inches between end 10 of the first sheet and end 6 of the second sheet.

The overlapping surfaces 13 of ends 6 and 8 of first sheet 4 and second sheet 8, respectively, are then joined by welding buttonhole slots 18, 20, and 22 through the use of a TIG (tungsten inert gas) welder which melts through the two NbTi foils or sheets 4 and 8 together forming a buttonhole slot which becomes the NbTi joint, or weld 32 along the seam between the sheets in the slots such as 18, 20 and 22. Plasma arc welding is also suitable for forming joint or weld 32. These Buttonhole-shaped slots, 18, 20, and 22 are substantially parallel and extend a distance of 2–3 centimeters in a direction indicated by arrow 16, which is the direction of current flow during superconducting operation. As illustrated by slot 22, longitudinal seams 24 and 26 extend in the direction of current flow 16 while the substantially shorter ends 28 and 30 are transverse to the longitudinal seams.

It is believed that superconducting operation and current flow through joints 18, 20 and 22 is along longitudinal seams 24 and 26, which as pointed out above extend in the direction of superconducting current flow 16. Welded joints 32 provided along longitudinal seams such as 24 and 26 for such superconducting current flow are much longer than if surfaces 15 and 17 were welded in area of overlap 3 and the distance of overlap 3 may be minimized to avoid increasing brittleness of the overlap. Superconducting joints formed utilizing sheets 4 and 6, 0.0035 to 0.0055 inches thick and having a starting current density ($J_c$) of at least $1.7 \times 10^9$ $A/M^2$ at 2 Tesla provided a $J_c$ between $2.4–5.0 \times 10^7$ $A/m^2$ at 2 Tesla, which was between 6 and 12% that of the starting material, and which is satisfactory to sustain superconducting operation in a shielding application. Use of higher $J_c$ in foils 4 and 8 would provide even better superconducting operation with respect to cryogen boiloff.

The combined or composite sheets 1 thus formed may be further joined with additional sheets as shown in FIG. 3 to provide the large superconducting cylinders from the relative small size of NbTi sheets commercially available.

Referring next to FIG. 3, the ends 12 and 14 (see FIGS. 1 and 2) are overlapped around a mandrel or forming cylinder 36 and secured by longitudinal slots 38, 40, and 42, welded in the same manner as slots 18, 20, and 22 to form a closed cylinder from NbTi sheets 4 and 8. These in turn are joined to second cylinder 37 formed in a manner similar to cylinder 36 from NbTi sheets, namely the overlapping of third sheet 44 and fourth sheet 46, the joints of which are welded along the overlap to form slots 54, 56, and 58 in the manner described above. Cylinders 36 and 37 are in turn overlapped and welded by welded slots 60 and 62 joining NbTi sheets 1, 2, 3, and 4 in a composite cylinder 50 which is large enough to surround a superconducting magnet assembly, indicated generally by arrow 52.

All of the slots such as 18, 20, 22, 38, 40, 42, 54, 56, 58, 60 and 62 extend in the same radial direction indicated by arrow 16 which is the direction of superconducting current flow across the joint during operation to expose their longer sides to the current flow path. Welds in accordance with the present invention have proven to conduct about 30 amps for each millimeter of weld in a 0.005 inch thick NbTi foils.

Superconducting shield 50 formed from first cylinder 36 and second cylinder 37 provides a shield that surrounds homogeneous superconducting main field coils (not shown) of superconducting magnet assembly 52 to magnetically protect the superconducting mainfield coils from the influence of gradient coils used to pulse the MRI and to perhaps isolate them from surrounding electronic equipment. Superconducting shield 50 could be utilized as a superconducting gradient shield for use in MRI's in the manner described in the copending patent application entitled "Superconducting Gradient Coil Shields in Magnetic Resonance Imaging Magnets" filed May 2, 1994, application Ser. No. 08/236,060, and assigned to the same assignee as the present invention.

The size, number, and location of welds in regions of overlap may be varied. The thickness of NbTi sheets 4 and 8 may vary from 0.0035 to 0.0055 inches with an approximate thickness of 0.004 inches. FIG. 4 shows an arrangement in which first foil 4 and second foil 8 are overlapped a greater distance than in FIG. 1, and an additional row of slots indicated as welded slots 23 and 25 are provided. The rows may be staggered and interleaved in part to minimize the overlaps.

The slots, however, extend in the same direction and are substantially parallel. That is, they extend in the direction of superconducting current flow indicated by arrow 16.

While the present invention has been described with respect to certain preferred embodiments thereof, it is to be understood that numerous variations and details of construction, the arrangement and combination of parts, and the type of materials used may be made without departing from the spirit and scope of the invention.

What we claim is:

1. A superconducting magnetic shield formed from a plurality of sheets of superconducting material for use in MRI superconducting magnets comprising:

a plurality of overlapping sheets of superconducting material selected from the group consisting of NbTi and Nb$_3$Sn joined together by a joint including at least one weld, said at lease one weld substantially around the periphery of at least one elongated aperture in the region of overlap extending in the direction of current flow along said sheets during operation of MRI, a weld seam extending substantially along the sides of said elongated aperture in the direction of said current flow; and wherein said weld seam is the selected superconducting material substantially spanning the periphery of said sheets in said aperture.

2. The superconducting sheet shield of claim 1 wherein said at least one elongated aperture includes a plurality of welded apertures extending in the direction of said superconducting current flow sheets.

3. The superconducting sheet shield of claim 2 wherein said plurality of apertures are substantially parallel.

4. The superconducting sheet of claim 1 wherein said weld substantially surrounds said aperture in a buttonhole configuration.

5. The superconducting sheet shield of claim 2 wherein the elongated apertures provide a length of weld substantially greater than the distance of said overlap in the direction of said current flow and wherein the ability of said weld seam to carry current increases in proportion to the length of the welds in the direction of current flow during operation.

6. The superconducting sheet shield of claim 5 wherein the length of said apertures is approximately 1–1¼ inches in said direction of superconducting current flow shield and said overlap is approximately 3 inches.

7. The superconducting sheet shield of claim 6 wherein the width of said apertures transverse to said superconducting current flow is significantly less than said length of said apertures.

8. The superconducting sheet of claim 7 wherein said NbTi sheet in the regions outside of said overlap is in the range of approximately 0.001–0.006 inches thick.

9. The superconducting NbTi sheet of claim 8 wherein said NbTi sheet in the regions outside of said overlap is approximately 0.004 inches thick.

10. A superconducting shield surrounding a superconducting magnet coil including sheets of NbTi joined together comprising:

a plurality of overlapping sheets of NbTi, weld material joining said plurality of overlapping sheets in the region of the overlap, said weld material extending substantially around a plurality of aligned slots extending in the direction of superconducting current flow through said sheets during operation;

said weld material joining said sheets along the edges of said slots in said direction of current flow; and wherein said welds are formed of NbTi.

11. The superconducting shield of claim 10 wherein said sheets are welded in a tubular configuration and form a shield surrounding said superconducting magnet.

12. The superconducting shield of claim 11 wherein said elongated apertures are approximately 1–1.25 inches long, and said overlap is approximately 3 inches long.

* * * * *